United States Patent [19]

Bacrania

[11] Patent Number: 4,677,321
[45] Date of Patent: Jun. 30, 1987

[54] TTL COMPATIBLE INPUT BUFFER

[75] Inventor: Kanti Bacrania, Palm Bay, Fla.

[73] Assignee: Harris Corporation, Melbourne, Fla.

[21] Appl. No.: 774,474

[22] Filed: Sep. 10, 1985

[51] Int. Cl.[4] .............. H03K 19/092; H03K 17/687; H03K 5/153; H03K 5/24

[52] U.S. Cl. .................. 307/475; 307/576; 307/585; 307/362; 307/594; 307/355; 307/247.1; 323/316; 323/317; 330/257

[58] Field of Search ............ 307/475, 264, 247 R, 307/594, 597, 200 B, 451, 585, 576, 579, 279, 362, 355; 323/312, 315, 316, 317; 330/257, 288

[56] References Cited

U.S. PATENT DOCUMENTS

| | | | |
|---|---|---|---|
| 3,591,855 | 7/1971 | Dean et al. | 307/304 |
| 4,031,409 | 6/1977 | Shimada et al. | 307/264 |
| 4,124,808 | 11/1978 | Shieu et al. | 307/362 |
| 4,318,013 | 3/1982 | Thomas et al. | 307/362 |
| 4,339,674 | 7/1982 | Hashimoto | 307/362 |
| 4,347,446 | 8/1982 | Price | 307/475 |
| 4,380,710 | 4/1983 | Cohen et al. | 307/475 |
| 4,438,349 | 3/1984 | Shoji | 307/362 |
| 4,439,695 | 3/1984 | Pelletier et al. | 307/475 |
| 4,446,444 | 5/1984 | Patterson, III | 307/264 |
| 4,450,371 | 5/1984 | Bismarck | 307/475 |
| 4,453,095 | 6/1984 | Wrathall | 307/475 |
| 4,527,076 | 7/1985 | Matsuo et al. | 307/362 |
| 4,598,215 | 7/1986 | Schechtman et al. | 307/362 X |
| 4,618,785 | 10/1986 | van Tran | 307/475 X |

FOREIGN PATENT DOCUMENTS 0154365 12/1979 Japan ................... 307/594

Primary Examiner—Stanley D. Miller
Assistant Examiner—David R. Bertelson
Attorney, Agent, or Firm—Barnes & Thornburg

[57] ABSTRACT

An input buffer circuit, especially well-suited for use as a TTL-TO-CMOS interface circuit, has a differential transistor pair at the input for stabilizing the circuit switching point relative to logic level voltage transitions occurring at the input. A preferred embodiment of the circuit has a first switching device in the input stage for decreasing the circuit response time to a first (e.g., high-to-low) logic level transition, and a second switching device for decreasing the response time to a second (e.g., low-to-high) logic level transition. Output buffers, in the form of inverters, may also be provided.

36 Claims, 3 Drawing Figures

TTL COMPATIBLE INPUT BUFFER

BACKGROUND AND SUMMARY OF INVENTION

This invention relates generally to interface circuits and, more particularly, to a circuit for interfacing transistor to transistor logic (TTL) circuits to complementary metal oxide semiconductor (CMOS) insulated gate field effect transistor circuits.

A number of circuits have been devised to address the problem of interfacing TTL circuits, which have logic voltage varations of 0.8 volts to 2.0 volts, to CMOS circuits which are designed for voltage swings of from 0 volts to 5 volts or higher. One class of circuits uses an inverter stage at the input of the interface circuit, with the inverters formed of appropriately sized and ratioed CMOS devices. These circuits are generally slow and must drive high capacitive loads. One method of increasing the speed of such circuits is described in U.S. Pat. No. 3,900,746 to Kraft et al. This method involves the use of a divertable current sink in the form of a third field effect transistor connected in series with the inverter. Although this is an improvement over prior art circuits, the series connection of the current sink with the N channel device on the output provides a resistance which limits the response time of the circuit.

Another drawback fo interface circuits of the inverter type is that the switching point of the circuit is very dependant upon the device threshold voltages. For devices with high thresholds operating at low temperatures, the input specifications are very difficult to maintain. Device thresholds are dependant upon manufacturing tolerances and may vary considerably. One approach to stabilizing the variations in operating point of an interface circuit is shown in U.S. Pat. No. 4,280,710 to Cohen et al., which is assigned to Harris Corporation. The circuit in Cohen is an interface circuit having a CMOS inverter with its N channel device being part of a controlled leg of a first current mirror and its P channel device being part of a controlled leg of a second current mirror. The other part of the controlled leg of the first current mirror is connected in series with the N channel device and in parallel with the P channel device and operates as a variable current source responsive to the input signal. The other part of the controlled leg of the second current mirror is likewise connected in series with the P channel device and in parallel with the N channel device and operates as a variable current sink responsive to the input signal. The controlling legs of the first and second current mirrors are connected to a reference voltage input. The components of the circuit are designed such that the operating point of the inverter is defined by the voltage on the reference voltage input. This approach stabilizes the switching point of the circuit and improves response time. However, considerable amounts of both power and area are consumed in the implementation of the circuit.

A third approach to the interfacing problem is illustrated by a class of circuits which employ classical differential input stages to stabilize the switching point. The differential stages are relatively slow, due to their linear voltage gain, and are also critically dependant on the stability of the reference voltage. Although the operating speed of the circuits can be increased, this is usually achieved at the expense of a considerable increase in power consumption.

An object of the present invention is to provide a TTL to CMOS interface circuit having a stabilized switching point and a fast response time.

Another object of the present invention is to provide a TTL to CMOS interface circuit which is relatively insensitive to reference voltage variations.

A further object of the present invention is to provide a TTL to CMOS interface circuit which is insensitive to variations in device tolerances over a wide range of operating and process conditions.

Still another object of the present invention is to provide a TTL to CMOS interface circuit which achieves the above objects without considerable increases in power consumption.

These and other objects of the invention are attained by an interface circuit having an input stage which includes a differential transistor pair and a current mirror to provide CMOS output voltage levels at an output terminal in response to TTL voltage levels at one of the inputs to the differential pair. The second differential pair input is connected to a reference voltage. To increase the response time of the circuit to a negative going input pulse, a first switching device, responsive to the voltage input, is connected from a first power supply terminal to the controlling leg of the current mirror. When the input voltage decreases, relative to the reference voltage, the switching device increases the current flow in the controllable leg of the current mirror. This increase is mirrored into the controlled leg of the current mirror which is connected to the output terminal. The increase in current flowing to the output terminal results in faster charging of the capacitance associated with the output terminal, decreasing the response time of the circuit. A second switching device, also responsive to the voltage at the circuit input, is preferably connected to the output terminal and to a second power supply terminal. When the voltage at the input increases relative to the reference voltage, the second switching device is activated to pull the output terminal low with minimal delay. The output terminal of the input stage may be buffered by one or more inverter circuits to provide both inverting and noninverting buffered outputs.

This circuit combines the precise switching of a linear differential input with the speed of a digital inverter to achieve the desired interfacing. The circuit requires low bias currents, is insensitive to process variations, and works over a wide range of reference voltages.

Other objects, advantages, and novel features of the interface circuit of the present invention will become apparent from the following detailed description of the invention when considered in conjunction with the accompanying drawings.

DETAILED DESCRIPTION OF THE DRAWINGS

Figure 1:
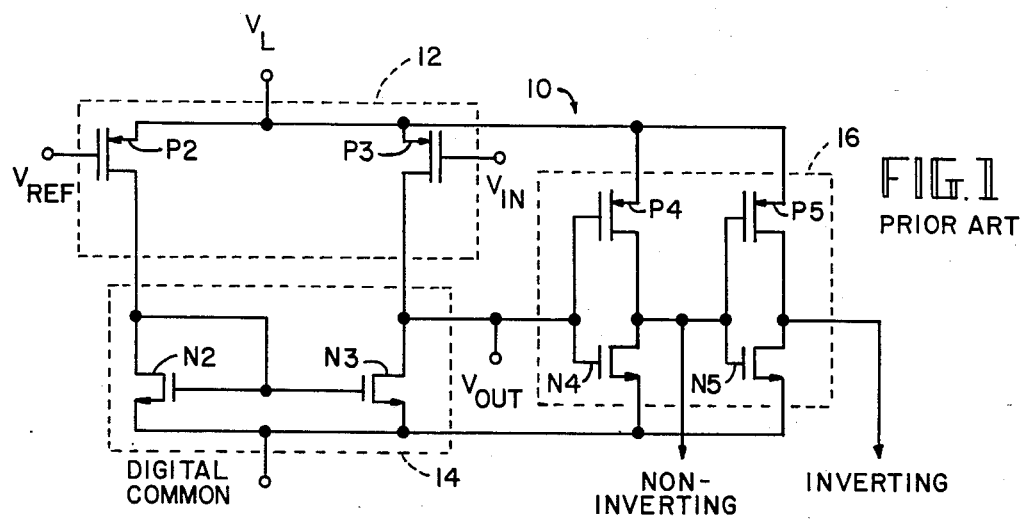
FIG. 1 is a schematic diagram of a prior art interface circuit.

FIG. 1 shows a prior art interface circuit 10 which includes an input stage 12, an output stage 14 and an output buffer 16. The input stage includes a differential transistor pair for sensing the voltage at input terminal $V_{IN}$ relative to reference voltage $V_{REF}$. Input terminal $V_{IN}$ is connected to the output of a TTL circuit and to the control terminal of transistor P3. One side of the main conduction path (i.e., the source) of transistor P3 is connected to a first terminal, $V_L$, of the CMOS voltage supply. Transistor P2, which is the other half of the differential pair, connected to $V_L$. The control terminal of transistor P2 is connected to reference $V_{REF}$. The transistors P2 and P3 are connected, respectively, to drains of transistors N2 and N3. The sources of transistors N2 and N3 are connected to the other side of the CMOS voltage supply which is labeled DIGITAL COMMON in the circuit of FIG. 1. The control terminals of N2 and N3 are connected together and to the drains of P2 and N2 so that transistors N2 and N3 form a current mirror which, in this embodiment, forms the output stage of the circuit. The controlled leg of the current mirror comprises the conduction paths of transistors P3 and N3 which are connected together at output terminal $V_{OUT}$. Output terminal $V_{OUT}$ is connected to the input of an inverter formed by transistors P4 and N4. The output of this inverter is connected, in turn, to the input of an inverter formed by transistors P5 and N5. These two inverters provide buffering for the output $V_{OUT}$ and allow for selection of inverting and noninverting outputs for connection to other circuits.

The circuit of FIG. 1 operates as follows. Voltage reference $V_{REF}$ is selected so that transistor P2 is at least partially on to supply current to the controllable leg of the current mirror. When a low voltage (e.g., 0.8 volts) is present at $V_{IN}$, P3 is on and output $V_{OUT}$ is pulled high. When the voltage at $V_{IN}$ increases to a high logic level (e.g., 2.0 volts), P3 is turned off interrupting the flow of current to $V_{OUT}$ and transistor N3 pulls $V_{OUT}$ low. The transition time for this change is determined by the time necessary for transistor P3 to turn off and for transistor N3 to discharge the capacitance at output terminal $V_{OUT}$. The current flow through N3 is governed by the current flow in the controllable leg of the current mirror (i.e., the current flow through transistor N2). For a high to low logic level transition at $V_{IN}$, the charging of the capacitance at output terminal $V_{OUT}$ is similarly governed by the current flow in the controllable leg of the current mirror. As a result, the response times for both low to high and high to low logic level transitions are relatively long.

Figure 2:
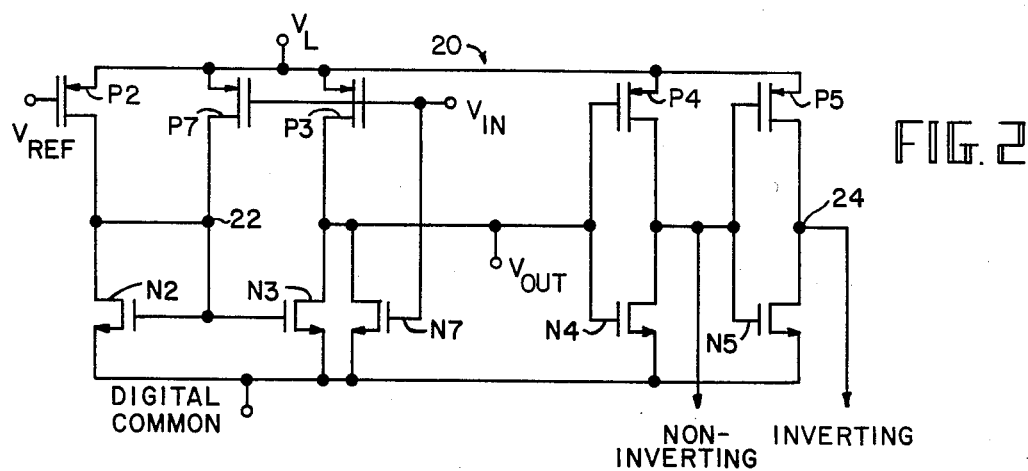
FIG. 2 is a schematic diagram of an interface circuit according to the present invention.

FIG. 2 is a schematic diagram of an interface circuit 20 which incorporates the improvements according to the present invention. With the exception of transistors P7 and N7, interface circuit 20 of FIG. 2 is similar to interface circuit 10 of FIG. 1. To avoid confusion, the reference designations used in FIG. 1 are also used in FIG. 2 for like components and terminals.

Transistor P7 in FIG. 2 has its source connected to the CMOS power supply terminal $V_L$, its drain connected to the control terminals of N2 and N3 at node 22, and its control terminal or gate connected to the input $V_{IN}$. Transistor N7 has its drain connected to the output terminal $V_{OUT}$, its source connected to the DIGITAL COMMON side of the CMOS power supply, and its control terminal or gate connected to input terminal $V_{IN}$.

The operation of interface circuit 20 in FIG. 2 is as follows. With a logic low level voltage (0.8 V) at input $V_{IN}$, transistor P3 is turned on and current flows into output terminal $V_{OUT}$ until the capacitance at that terminal is fully charged. Transistor P7 is turned on by the low level logic voltage at $V_{IN}$, adding to the current flow that is mirrored into the output terminal. Transistor N7 is off. When a low to high transition begins at $V_{IN}$, transistor N7 starts to turn on when the voltage at $V_{IN}$ reaches about 1.0 volts. For the same transition in interface circuit 10 of FIG. 1, which does not have transistor N7, current continues to flow into output node $V_{OUT}$ until transistor P3 is turned all the way off by the rising voltage at $V_{IN}$. However, with transistor N7 connected as shown in FIG. 2, output node $V_{OUT}$ begins discharging almost instantaneously as the voltage at $V_{IN}$ rises. Thus, transistor N7, which might be referred to as a pull down transistor, improves the response time of interface circuit 20 when the voltage at input $V_{IN}$ goes from a low to a high logic level.

With the voltage level at input terminal $V_{IN}$ at a high logic level (2.0 volts), transistor P3 is off and transistor N7 is on, connecting output termining $V_{OUT}$ to the DIGITAL COMMON side of the CMOS voltage supply. For a high to low logic level voltage transition at input $V_{IN}$, interface circuit 20 works as follows. The falling voltage at $V_{IN}$ turns transistor N7 off and transistor P3 on. Thus, current begins to flow through transistor P3 to charge the capacitance associated with output terminal $V_{OUT}$. However, the falling voltage at $V_{IN}$ which causes a current increase through transistor P3 also causes a reduction in the current flowing through transistor P2, thus decreasing the drive to the current mirror. For a similar transition in interface circuit 10 of FIG. 1, the decreased current mirror drive results in an increase in the amount of time required to charge the capacitance at output terminal $V_{OUT}$. However, in interface circuit 20 of FIG. 2, the presence of transistor P7 prevents this delay. Transistor P7, which is small relative to transistors P2 and P3, is turned on harder by the falling voltage at $V_{IN}$, conducting additional current into the controllable leg of the current mirror. This results in a proportional increase in the current flowing through transistor P3 into output terminal $V_{OUT}$. Thus, the output terminal capacitance is charged faster and the response time of the circuit is improved.

Figure 3:
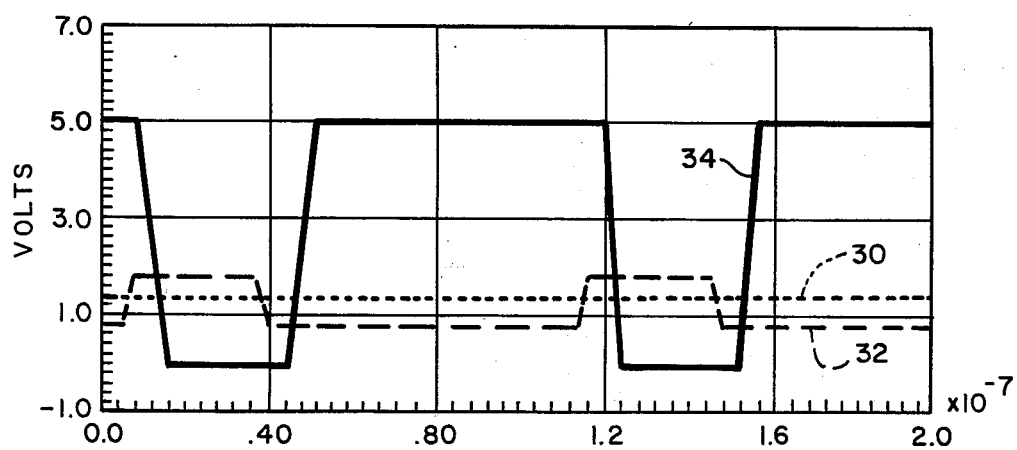
FIG. 3 is a plot of waveforms at selected terminals of the circuit of FIG. 2.

FIG. 3 shows voltage waveforms for the voltage transitions described with reference to interface circuit 20 of FIG. 2. Waveform 30 represents the reference voltage $V_{REF}$, which in this preferred embodiment is 1.4 volts. Waveform 32 shows the input voltage at input $V_{IN}$, which is connected to the output of a TTL circuit. The TTL voltage ranges from a low of 0.8 volts to a high of approximately 2.0 volts. Waveform 34 represents the waveform at terminal 24 in FIG. 2 which is the "noninverting" output of the inverter formed by transistors P5 and N5.

As noted above, transistor P7 is small relative to the sizes of transistors P2 and P3. Transistor N7 is comparable in size to transistors P2 and P3. The remaining transistors can be sized to optimize overall circuit operation.

It should be noted that the 0.8 volts to 2.0 volts range for input voltage $V_{IN}$ is considered by applicant to be a minimum input voltage range. However, correct polarity is obtained at the output for operation in the range of 1.0 volts to 1.8 volts. The circuit, is, of course, well-suited for operation with input voltages which exceed the minimum range.

It should also be noted that, while a reference voltage of 1.4 volts is preferred for the particular application shown and illustrated above, the circuit works well over a range of reference voltages, with appropriate ranges of inputs at the $V_{IN}$ terminal. For example, if a reference voltage of 1.4 volts is used, the preferred input voltage range is 0.8–2.0 volts. If a reference voltage of 0.5 volts is selected, the preferred input voltage range is 0–1.0 volts. Optimal performance is attained when the reference voltage is centered with respect to the input voltage swing. However, the circuit will function when this is not the case, although the speed will be somewhat degraded.

As discussed above, the differential transistor pair formed by transistors P2 and P3 will switch at the reference voltage plus or minus the voltage offset of the pair (approximately 50-100 millivolts). Therefore, the switching point of interface circuit 20 can be precisely determined, independently of manufacturing process tolerances. If for some reason, the reference voltage supplied to the circuit is lost (i.e., $V_{REF}=0$), interface circuit 20 will still function, in a manner similar to the "inverter" interface circuits mentioned above. In this case, the switching point of the circuit is determined by the threshold levels of the devices.

Although the invention has been described and illustrated in detail, it is to be clearly understood that this description is to be taken by way of illustration and example only and not by way of limitation. Although the circuit described is especially well-suited for application as a TTL to CMOS interface, the principals employed are applicable to interface other systems having similar interfacing problems. The use of complementary types of FET transistors, or the use of other semiconductor devices in the manner shown in the circuit described are considered to be well within the scope of the present invention. The spirit and scope of this invention are to be limited only by the terms of the appended claims.

What is claimed is:

1. In an input buffer circuit having an input stage which includes a differential transistor pair and a current mirror serially connected between first and second terminals of a voltage supply, a first input to the differential transistor pair connected to an output of a circuit whose output is to be buffered, a second input to the differential transistor pair connected to a reference voltage, and an output terminal at a junction of a controlled leg of the current mirror and a main current carrying path of the differential pair, the improvement comprising:

pull-up means, connected between the first terminal of the voltage supply and a controllable leg of the current mirror, for providing current to the current mirror when the voltage at the first input to the differential pair decreases relative to the reference voltage at the second input to the differential pair.

2. A circuit according to claim 1, wherein said pull-up means is a three-terminal switching device having a first terminal connected to the first terminal of the voltage supply, a second terminal connected to the controllable leg of the current mirror and a control terminal connected to the first input.

3. A circuit according to claim 1, wherein said three-terminal switching device is a transistor.

4. A circuit according to claim 1, further comprising pull-down means for connecting the output terminal and the second terminal of the voltage supply when the voltage at the first input to the differential pair increases relative to the reference voltage at the second input to the differential pair.

5. A circuit according to claim 4, wherein said pull-down means is a three terminal switching device having a first terminal connected to the output terminal, a second terminal connected to the second terminal of the voltage supply and a control terminal connected to the first input.

6. A circuit according to claim 5, wherein said three-terminal switching device is a transistor.

7. A circuit according to claim 1, further comprising an output stage connected to the output terminal of the input stage.

8. A circuit according to claim 7, wherein said output stage comprises at least one inverter.

9. A circuit according to claim 1, wherein the reference voltage is approximately 1.4 volts and wherein the output of the circuit whose output is to be buffered varies between approximately 0.8 volts and 2.0 volts.

10. A TTL-TO-CMOS interface circuit comprising:
first and second voltage supply terminals;
a differential input stage having a first input connected to an output of a TTL circuit and having a second input connected to a reference voltage, and having respective first and second current conducting paths connected at one end to the first voltage supply terminal;
a current mirror having a controllable leg connected between the second voltage supply terminal and the second current conducting path of the differential input stage, and having a controlled leg connected between the second voltage supply terminal and the first current conducting path of the differential input stage at an output terminal; and
pull-up means, connected to the first voltage supply terminal and the current mirror, for supplying current to the controllable leg of the current mirror in response to a low logic level voltage at the first input of the differential stage.

11. A TTL-TO-CMOS interface circuit according to claim 10, wherein the pull-up means is a three-terminal switching device having a first terminal connected to the first terminal of the voltage supply, a second terminal connected to the controllable leg of the current mirror and a control terminal connected to the first input.

12. A TTL-TO-CMOS interface circuit according to claim 11, wherein said three terminal switching device is a transistor.

13. A TTL-TO-CMOS interface circuit according to claim 10, further comprising pull-down means for connecting the output terminal to the second voltage supply terminal in response to a high logic level voltage at the first input.

14. A TTL-TO-CMOS interface circuit according to claim 13, wherein said pull-down means is a three-terminal switching device having a first terminal connected to the output terminal, a second terminal connected to the second terminal of the voltage supply and a control terminal connected to the first input.

15. A TTL-TO-CMOS interface circuit according to claim 14, wherein said three-terminal switching device is a transistor.

16. A TTL-TO-CMOS interface circuit according to claim 10, further comprising an output stage connected to the output terminal of the input stage.

17. A TTL-TO-CMOS interface circuit according to claim 16, wherein said output stage comprises at least one inverter.

18. A TTL-TO-CMOS interface circuit according to claim 10, wherein the reference voltage is approximately 1.4 volts, and wherein the output of the TTL circuit varies between approximately 0.8 volts and 2.0 volts.

19. An interface circuit, comprising:
first and second voltage supply terminals connected to respective terminals of a voltage supply;
an input stage connected to the first voltage supply terminal and having a first input, a second input connected to a reference voltage, and means for detecting a voltage level transition, relative to the reference voltage, at the first input;
an output stage, connected to the input stage and to the second voltage supply terminal, having an output terminal and means for producing a voltage level at the output terminal in response to a voltage level at the first input of the input stage; and
first switching means, connected to the first voltage supply terminal and to the output stage, for decreasing a response time of the output stage when a first voltage level transition occurs at the first input of the input stage.

20. An interface circuit according to claim 19, wherein the first voltage level transition is a high to low logic level transition.

21. An interface circuit according to claim 20, wherein the high logic level is approximately 2.0 volts, the low logic level is approximately 0.8 volts, and the reference voltage is approximately 1.4 volts.

22. An interface circuit according to claim 19, wherein the input stage includes a differential transistor pair.

23. An interface circuit according to claim 22, wherein the differential transistor pair includes:
a first transistor having a first terminal connected to the first voltage supply terminal, a second terminal connected to the output stage, and a control terminal connected to the first input of the input stage; and
a second transistor having a first terminal connected to the first voltage supply terminal, a second terminal connected to the output stage, and a control terminal connected to the referenced voltage.

24. An interface circuit according to claim 23, wherein the output stage includes a current mirror having a controllable leg connected between the second terminal of the second transistor and the second voltage supply terminal, and having a controlled leg connected between the second terminal of the first transistor and the second voltage supply terminal, and wherein the output terminal is connected to the second terminal of the first transistor.

25. An interface circuit according to claim 19, wherein the output stage includes a current mirror having a controllable and controlled legs connected between the input stage and the second voltage supply terminal, and wherein the output terminal is connected to a juncture of the controlled leg and the input stage.

26. An interface circuit according to claim 25, wherein said first switching means is a three-terminal device having a first terminal connected to the first voltage supply terminal, a second terminal connected to the controllable leg of the current mirror, and a control terminal connected to the first input of the input stage.

27. An interface circuit according to claim 26, wherein the three-terminal device is a transistor.

28. An interface circuit according to claim 19, wherein the first switching means is a three-terminal device having a first terminal connected to the first voltage supply terminal, a second terminal connected to the output stage, and a control terminal connected to the first input of the input stage.

29. An interface circuit according to claim 28, wherein the three-terminal device is a transistor.

30. An interface circuit according to claim 19, further comprising second switching means, connected between the output terminal and the second voltage supply terminal, for decreasing the response time of the output stage when a second voltage level transition occurs at the first input of the input stage.

31. An interface circuit according to claim 30, wherein the second voltage level transition is a low to high logic level transition.

32. An interface circuit according to claim 31, wherein the high logic level is approximately 2.0 volts, the low logic level is approximately 0.8 volts, and the reference voltage is approximately 1.4 volts.

33. An interface circuit according to claim 30, wherein the second switching means is a three-terminal device having a first terminal connected to the output terminal, a second terminal connected to the second voltage supply terminal, and a control terminal connected to the first input of the input stage.

34. An interface circuit according to claim 31, wherein the three-terminal device is a transistor.

35. An interface circuit according to claim 19, further comprising an output buffer stage connected to the output terminal.

36. An interface circuit according to claim 35, wherein the output buffer stage includes at least one inverter.

* * * * *